(12) United States Patent
Covic et al.

(10) Patent No.: US 12,415,429 B2
(45) Date of Patent: Sep. 16, 2025

(54) INDUCTIVE POWER TRANSFER SYSTEM AND METHOD

(71) Applicant: Auckland UniServices Limited, Auckland (NZ)

(72) Inventors: Grant Anthony Covic, Mount Albert (NZ); John Talbot Boys, Takapuna (NZ)

(73) Assignee: AUCKLAND UNISERVICES LIMITED, Auckland (NZ)

( * ) Notice: Subject to any disclaimer, the term of this patent is extended or adjusted under 35 U.S.C. 154(b) by 634 days.

(21) Appl. No.: 14/365,873

(22) PCT Filed: Dec. 18, 2012

(86) PCT No.: PCT/IB2012/002730
§ 371 (c)(1),
(2) Date: Jun. 16, 2014

(87) PCT Pub. No.: WO2013/088238
PCT Pub. Date: Jun. 20, 2013

(65) Prior Publication Data
US 2015/0028849 A1 Jan. 29, 2015

(30) Foreign Application Priority Data
Dec. 16, 2011 (NZ) ........................................ 597174

(51) Int. Cl.
*G01R 21/00* (2006.01)
*B60L 53/122* (2019.01)
(Continued)

(52) U.S. Cl.
CPC ............ *B60L 53/122* (2019.02); *B60L 53/124* (2019.02); *B60L 53/126* (2019.02); *B60L 53/20* (2019.02);
(Continued)

(58) Field of Classification Search
CPC ........ G01R 21/006; G02J 50/90; G02J 50/60; G02J 50/80; G02J 50/10; B60L 11/1811;
(Continued)

(56) References Cited

U.S. PATENT DOCUMENTS 5,528,113 A * 6/1996 Boys ................... B60L 11/1812
318/16
6,275,139 B1 8/2001 Shimomura et al.
(Continued)

FOREIGN PATENT DOCUMENTS

CN 1271878 A 11/2000
CN 101483357 A 7/2009
(Continued)

OTHER PUBLICATIONS

"International Application No. PCT/IB2012/002730, International Search Report and Written Opinion mailed Jun. 12, 2013", (Jun. 12, 2013), 16 pgs.
(Continued)

*Primary Examiner* — Lee E Rodak
(74) *Attorney, Agent, or Firm* — Piloff Passino & Cosenza LLP; Martin J. Cosenza

(57) ABSTRACT

Foreign object detection apparatus for an IPT system, includes a control means adapted to detect the presence of a foreign object on or adjacent to an IPT primary pad of the system.

31 Claims, 4 Drawing Sheets

(51) Int. Cl.
  *B60L 53/124* (2019.01)
  *B60L 53/126* (2019.01)
  *B60L 53/20* (2019.01)
  *H02J 50/10* (2016.01)
  *H02J 50/60* (2016.01)
  *H02J 50/80* (2016.01)
  *H02J 50/90* (2016.01)
  *G01V 3/10* (2006.01)

(52) U.S. Cl.
  CPC ............ *G01R 21/006* (2013.01); *H02J 50/10* (2016.02); *H02J 50/60* (2016.02); *H02J 50/80* (2016.02); *H02J 50/90* (2016.02); *B60L 2210/30* (2013.01); *B60L 2270/147* (2013.01); *G01V 3/10* (2013.01); *Y02T 10/70* (2013.01); *Y02T 10/7072* (2013.01); *Y02T 10/72* (2013.01); *Y02T 90/12* (2013.01); *Y02T 90/14* (2013.01)

(58) Field of Classification Search
  CPC .... B60L 11/182; B60L 2210/30; B60L 5/005; B60L 2270/147; H02J 17/00; H02J 5/005; H02J 7/025; H02J 50/10; H02J 50/12; H02J 50/60; H02J 50/80; H02J 50/90; H02J 50/00; H02J 50/05; H02J 50/15; H02J 50/20; H02J 50/23; H02J 50/70; H02J 50/50; H02J 50/40; H02J 50/30; H02J 50/27; G01V 3/10; H01F 38/14; H01F 27/006; Y10T 307/297; H02G 7/16; H04B 5/0037; Y02T 90/122; Y02T 10/7241; Y02T 10/7072; Y02T 90/14; Y02T 90/127; Y02T 10/7005
  USPC ...... 307/104; 320/108; 324/654, 76.75, 127, 324/76.11, 207.15–207.19, 240
  See application file for complete search history.

(56) References Cited

U.S. PATENT DOCUMENTS

| | | | | |
|---|---|---|---|---|
| 8,575,944 | B2 * | 11/2013 | Dorairaj ................. | H02J 5/005 307/104 |
| 8,620,484 | B2 | 12/2013 | Baarman et al. | |
| 8,766,487 | B2 * | 7/2014 | Dibben ................... | H02J 5/005 307/104 |
| 9,073,442 | B2 | 7/2015 | Ichikawa | |
| 2007/0228833 | A1 * | 10/2007 | Stevens .................. | H02J 5/005 307/45 |
| 2009/0174264 | A1 * | 7/2009 | Onishi .................... | H02J 5/005 307/104 |
| 2010/0225173 | A1 | 9/2010 | Aoyama et al. | |
| 2011/0196544 | A1 * | 8/2011 | Baarman ................. | H01F 38/14 700/291 |
| 2012/0200151 | A1 | 8/2012 | Obayashi et al. | |
| 2012/0313579 | A1 * | 12/2012 | Matsumoto ............. | H02J 7/025 320/108 |
| 2013/0257165 | A1 * | 10/2013 | Singh ...................... | G01V 3/12 307/98 |
| 2014/0191715 | A1 * | 7/2014 | Wechlin ................. | B60L 11/182 320/108 |

FOREIGN PATENT DOCUMENTS

| | | | | |
|---|---|---|---|---|
| CN | 102803005 | A | 11/2012 | |
| CN | 102823101 | A | 12/2012 | |
| EP | 2017940 | A2 | 1/2009 | |
| JP | 2010-220418 | A | 9/2010 | |
| JP | 2011-160515 | A | 8/2011 | |
| JP | 2011-211760 | A | 10/2011 | |
| JP | 2011-254633 | A | 12/2011 | |
| KR | 10-2008-0094953 | | 10/2008 | |
| NZ | 274939 | A | 6/1997 | |
| WO | WO-2008/140333 | | 11/2008 | |
| WO | WO-2008/140333 | A2 | 11/2008 | |
| WO | WO-2009081115 | A1 * | 7/2009 | ............ B60L 53/122 |
| WO | WO-2011/016737 | A1 | 2/2011 | |
| WO | WO-2012/018268 | | 2/2012 | |
| WO | WO-2012/018269 | | 2/2012 | |
| WO | WO-2013/088238 | | 6/2013 | |

OTHER PUBLICATIONS

Kuyvenhoven, Neil, et al., "Development of a foreign object detection and analysis method for wireless power systems", 2011 IEEE Symposium on Product Compliance Engineering (PSES), Conference Publications, San Diego, CA, (Oct. 12, 2011), 1-6.
"Chinese Application Serial No. 201280069521.1, Office Action mailed Feb. 7, 2017", (w/ English Translation), 11 pgs.
"Chinese Application Serial No. 201280069521.1, Office Action mailed Mar. 31, 2016", (w/ English Translation), 28 pgs.
"Chinese Application Serial No. 201280069521.1, Office Action mailed Jun. 22, 2017", (w/ English Translation), 9 pgs.
"European Application Serial No. 12858565.0, Office Action mailed Sep. 23, 2019", 6 pgs.
"European Application Serial No. 12858565.0, Office Action mailed Dec. 21, 2018", 4 pgs.
"European Application Serial No. 12858565.0, Response filed Apr. 17, 2020 to Office Action mailed Sep. 23, 2019", 12 pgs.
"European Application Serial No. 12858565.0, Response filed May 16, 2019 to Office Action mailed Dec. 21, 2018", 7 pgs.
"Japanese Application Serial No. 2014-546664, Office Action mailed Jan. 10, 2017", (w/ English Translation), 12 pgs.
"Japanese Application Serial No. 2014-546664, Office Action mailed Sep. 5, 2017", (w/ English Translation), 4 pgs.
"Japanese Application Serial No. 2014-546664, Written Argument and Amendment filed Jun. 12, 2017 in response to Office Action mailed Jan. 10, 2017", (w/ English Translation), 13 pgs.
"Japanese Application Serial No. 2014-546664, Written Argument and Amendment filed Dec. 5, 2017 in response to Office Action mailed Sep. 5, 2017", (w/ English Translation), 9 pgs.

* cited by examiner

INDUCTIVE POWER TRANSFER SYSTEM AND METHOD

PRIORITY CLAIM TO RELATED APPLICATIONS

This application is a U.S. national stage application filed under 35 U.S.C. § 371 from International Application Serial No. PCT/IB2012/002730, which was filed Dec. 18, 2012, and published as WO 2013/088238 on Jun. 20, 2013, and which claims priority to New Zealand Application No. 597174, filed Dec. 16, 2011, which applications and publication are incorporated by reference as if reproduced herein and made a part hereof in their entirety, and the benefit of priority of each of which is claimed herein.

FIELD OF THE INVENTION

The present invention relates to a system and method for detecting foreign objects in an Inductive Power Transfer (IPT) system, and to detecting alignment or relative position of magnetic power transfer structures in an IPT system. The invention also relates to improving the safety of an IPT system, for example mitigating the fire risk from a high power IPT system for charging an electric vehicle at a high rate.

BACKGROUND

In the development of pure electric vehicles (i.e., those powered solely by electricity as opposed to hybrid vehicles), there are a number of problems to be solved before these vehicles can gain widespread acceptance. One of the major issues is the inconvenience and safety concerns associated with charging the vehicle's battery.

Inductive Power Transfer (IPT) provides a useful alternative to more conventional charging. An IPT system is described in U.S. Pat. No. 5,293,308.

Among other advantages, the use of IPT obviates the need for a user to manually connect a cable to the battery. In preferred embodiments it may only be necessary to drive the vehicle over an IPT charging pad embedded in (or placed on top of) the roadway or car park for the charging to take place.

In the development of inductive charging of electric vehicles using a roadway mounted transmitter pad to couple magnetic flux to a pad under the vehicle, an issue of concern is the heating of miscellaneous objects that might be lying on the ground mounted pad. One drawback of the inherent convenience of the IPT system is that the user is unlikely to check that the IPT pad is clear of foreign objects (being objects that may reduce the efficiency or pose a risk for operation of an IPT system, for example metallic objects) or rubbish before parking the vehicle over the pad and commencing charging.

One solution to this problem is to provide a sophisticated electronic Foreign Object Detection (FOD) system, but such a system would need to work under difficult conditions and would need to be extremely sensitive. In addition, the pad on the road and the pad on the vehicle may be manufactured by different organisations using different tuning technologies and different magnetic circuit structures, thereby creating an additional complication.

In some cases even very small objects, for example thin foil from cigarette or chewing gum packaging, may raise a safety issue if located on an IPT pad during a charging operation. Small pieces of metalized paper may catch fire under some charging conditions. The burning of the paper itself may be inconsequential, but if there is also other combustible material in the immediate vicinity, for example dry leaves under the vehicle, then these may also catch fire, meaning that the situation can rapidly become more serious.

Larger objects (for example aluminium cans) may not themselves catch fire, but may get very hot, such that when the car moves away from the charging pad there are hot pieces left that a child could pick up and injure themselves with. Very large objects may stop the charging process itself.

Throughout this specification reference to "IPT" means "Inductive Power Transfer". Reference to an "IPT pad" is to a coil or plurality of coils configured for use in creating magnetic fields for energy transfer, or deriving energy from magnetic fields, as part of an IPT system. Reference to magnetic structure includes pads or other arrangements of conductive elements (e.g. an IPT system track or a coil) which are used to transfer energy through use of magnetic fields in an IPT system. The term "primary", refers to the magnetic structure which is energised to create a magnetic field, and the term "secondary", refers to the magnetic structure in which electrical current is induced by the magnetic field from the primary or transmitter structure. Thus "primary pad" and "transmitter pad" refer to pad structures which are energised to create a magnetic field, and the term "secondary pad" refers to the pad structures in which electrical current is induced by the magnetic field from the primary structure.

All previous patent specifications referred to in this specification by application number or publication number are incorporated herein by reference in their entirety. However, the reference to any prior art in the specification is not, and should not be taken as, an acknowledgement or any form of suggestion that the prior art forms part of the common general knowledge in any country.

Object of the Invention

It is an object of the present invention to provide an IPT system, or apparatus or methods for use with IPT systems, which will overcome or ameliorate problems with such systems at present, or which will at least provide a useful choice.

It is a further or alternative object to provide a method or apparatus for detecting the presence of a foreign object in a magnetic field created by an IPT primary pad, or a foreign object on or in the vicinity of an IPT primary pad which will overcome or ameliorate problems with such systems at present, or which will at least provide a useful choice.

It is a further or alternative object of the invention to provide methods or apparatus for detecting relative position or alignment between a primary magnetic structure and a secondary magnetic structure of an IPT system.

It is a further or alternative object of the present invention to provide a system and method of mitigating a fire risk from IPT pads which will overcome or ameliorate problems with such systems or methods at present, or which will at least provide a useful choice.

Other objects of the present invention may become apparent from the following description, which is given by way of example only.

BRIEF SUMMARY OF THE INVENTION

According to one aspect a foreign object detection apparatus for an IPT system is provided, the apparatus comprising a control means adapted to detect the presence of a foreign object on or adjacent to an IPT primary pad of the system.

Preferably the control means uses the IPT primary pad and/or an IPT secondary pad to detect the foreign object.

Preferably the control means is adapted to detect when an IPT secondary pad is in a charging position with respect to the IPT primary pad.

Preferably the control means is adapted to selectively reduce power transferred by the system on detection of a foreign object.

Preferably the control means detects a foreign object by at least:
    determining an expected rate of power transfer;
    determining the actual rate of power transfer; and
    comparing the expected rate of power transfer with the actual rate of power transfer.

Preferably the apparatus determines whether the actual rate of power transfer is less than the expected rate of power transfer by more than a predetermined amount.

Preferably the apparatus includes means to measure relative position between an IPT primary pad of the system and an IPT secondary pad of the system.

Preferably the means to measure relative position are adapted to measure electrical characteristics of the IPT primary and secondary pads.

Preferably the means to measure relative position are adapted to measure the lateral offset of the primary and secondary pads by the phase and magnitude of short circuit currents.

Preferably the means to measure relative position are adapted to measure the lateral offset by the voltage(s) induced in the IPT secondary pad.

Preferably the apparatus includes means to measure distance between the primary and secondary pads by comparing magnitudes of currents in the IPT primary and IPT secondary pads.

Preferably the apparatus includes a communication means for communicating information about one or both of the IPT primary pad and the IPT secondary pad to the control means.

In a further aspect a method of operating an IPT system to detect the presence of a foreign object is provided, the method including:
    determining an expected rate of power transfer;
    determining the actual rate of power transfer; and
    comparing the expected rate of power transfer with the actual rate of power transfer.

Preferably the method includes determining if the actual rate of power transfer is less than the expected rate of power transfer by more than a predetermined amount.

Preferably the method includes measuring relative position between an IPT primary pad of the system and an IPT secondary pad of the system.

Preferably measuring relative position includes measuring electrical characteristics of the IPT primary and secondary pads.

Preferably measuring relative position includes measuring the lateral offset of the primary and secondary pads by the phase and magnitude of short circuit currents.

Preferably measuring relative position includes measuring the lateral offset by the voltage(s) induced in the IPT secondary pad.

Preferably the method includes measuring distance between the primary and secondary pads by comparing magnitudes of currents in the IPT primary and IPT secondary pads.

Preferably the method includes communicating information about one or both of the IPT primary pad and the IPT secondary pad to a control means.

In another aspect foreign object detection apparatus for an IPT system is provided, the apparatus comprising a control means adapted to determine VAR currents due to relative position between an IPT primary pad and an IPT secondary pad, and measure the actual VAR currents in the IPT primary pad to determine whether a foreign object is present on or adjacent to the IPT primary pad.

Preferably the control means includes position detection means to detect the relative position of the IPT primary and IPT secondary pad.

Preferably the position detection means measure electrical characteristics of the IPT primary and IPT secondary pads to detect the position of one pad relative to the other.

Preferably the position detection means measure the lateral offset of the primary and secondary pads by the phase and magnitude of short circuit currents.

Preferably the position detection means measure the lateral offset by the voltage(s) induced in the IPT secondary pad.

Preferably the position detection means measure distance between IPT primary and secondary pads by comparing magnitudes of currents in the IPT primary and IPT secondary pads.

Preferably the apparatus includes means to communicate information about one or both of the IPT primary pad and the IPT secondary pad to the control means.

In another aspect a method of operating an IPT system to detect the presence of a foreign object is provided, the method including:
    determining VAR currents due to relative position of an IPT primary pad and an IPT secondary pad; and
    measuring the actual VAR currents in the IPT primary pad to determine whether a foreign object is present on or adjacent to the IPT primary pad.

Preferably the method includes measuring relative position of the IPT primary pad and the IPT secondary pad of the system.

Preferably measuring relative position includes measuring electrical characteristics of the IPT primary and IPT secondary pads to detect the position of one pad relative to the other.

Preferably measuring relative position includes measuring the lateral offset of the primary and secondary pads by the phase and magnitude of short circuit currents.

Preferably measuring relative position includes measuring the lateral offset by the voltage(s) induced in the IPT secondary pad.

Preferably the method includes measuring distance between the IPT primary pad and the IPT secondary pad by comparing magnitudes of currents in the IPT primary and IPT secondary pads.

Preferably the method includes communicating information about one or both of the IPT primary pad and the IPT secondary pad to a control means.

In another aspect apparatus for detecting relative position between an IPT system primary magnetic structure and a secondary magnetic structure is provided, the apparatus comprising a position detection means adapted to measure electrical characteristics of the IPT primary and IPT secondary magnetic structures to detect the position of one pad relative to the other.

Preferably the position detection means measure the lateral offset of the primary and secondary structures by the phase and magnitude of short circuit currents.

Preferably the position detection means measure the lateral offset by the voltage(s) induced in the IPT secondary structure.

Preferably the position detection means measure distance between IPT primary and secondary structures by comparing magnitudes of currents in the IPT primary and IPT secondary structures.

In another aspect a method for detecting relative position between an IPT system primary magnetic structure and a secondary magnetic structure is provided, the method comprising measuring electrical characteristics of the IPT primary and IPT secondary magnetic structures to detect the position of one pad relative to the other.

Preferably the method includes measuring the lateral offset of the primary and secondary structures by the phase and magnitude of short circuit currents.

Preferably the method includes measuring the lateral offset by the voltage(s) induced in the IPT secondary structure.

Preferably the method includes measuring the distance between IPT primary and secondary structures by comparing magnitudes of currents in the IPT primary and IPT secondary structures.

In another aspect an IPT system is provided, comprising:
a control means, and;
an air flow means;
whereby the control means selectively operates the air flow means to create an air flow which flows over a surface of an IPT primary pad of the system.

Preferably the control means operates the air flow means as part of a fire mitigation strategy.

Preferably the control means is adapted to detect when an IPT secondary pad is in a power transfer position with respect to an IPT primary pad.

Preferably the control means is adapted to selectively reduce power transferred by the system as part of a fire mitigation strategy.

Preferably the control means is adapted to detect the presence of a foreign object on or adjacent to an IPT primary pad.

Preferably the control means detects a foreign object by at least:
determining an expected rate of power transfer;
determining the actual rate of power transfer; and
comparing the expected rate of power transfer with the actual rate of power transfer.

Preferably the control means determines whether the actual rate of power transfer is less than the expected rate of power transfer by more than a predetermined amount.

Preferably the system includes means to measure relative position between an IPT primary pad of the system and an IPT secondary pad of the system.

Preferably the means to measure relative position measure electrical characteristics of the IPT primary and secondary pads.

Preferably the means to measure relative position are adapted to measure the lateral offset of the primary and secondary pads by the phase and magnitude of short circuit currents.

Preferably the means to measure relative position are adapted to measure the lateral offset by the voltage(s) induced in the IPT secondary pad.

Preferably the system further includes means to measure distance between the IPT primary and secondary pads by comparing magnitudes of currents in the IPT primary and IPT secondary pads.

Preferably the system further includes a communication means for communicating information about one or both of the IPT primary pad and the IPT secondary pad to the control means.

In another aspect a method of operating an IPT system is provided, comprising the steps of:
i) determining when an IPT secondary pad is in a charging position with respect to an IPT primary pad of the system, and
ii) operating an air flow means to create an air flow which flows over a surface of the IPT primary pad.

Preferably the method includes operating the air flow means as part of a fire mitigation strategy.

Preferably the method includes operating the air flow means prior to commencing charging.

Preferably the method includes the step of reducing power transferred by the system as part of a fire mitigation strategy.

Preferably the method includes the step of detecting whether a foreign object is located on or adjacent to the IPT system primary pad.

Preferably the method includes the step of detecting a foreign object includes the steps of at least:
determining an expected rate of power transfer;
determining the actual rate of power transfer; and
comparing the expected rate of power transfer with the actual rate of power transfer.

Preferably the method includes determining if the actual rate of power transfer is less than the expected rate of power transfer by more than a predetermined amount.

Preferably the method includes measuring relative position between an IPT primary pad of the system and an IPT secondary pad of the system.

Preferably the method includes measuring electrical characteristics of the IPT primary and secondary pads to measure relative position.

Preferably measuring relative position includes measuring the lateral offset of the primary and secondary pads by the phase and magnitude of short circuit currents.

Preferably measuring relative position includes measuring the lateral offset by the voltage(s) induced in the IPT secondary pad.

Preferably the method includes measuring distance between the primary and secondary pads by comparing magnitudes of currents in the IPT primary and IPT secondary pads.

Preferably the method includes communicating information about one or both of the IPT primary pad and the IPT secondary pad to a control means.

In another aspect a system for mitigating a fire risk from an IPT primary pad is provided, the system comprising an IPT system according to any one of the preceding statements.

In another aspect the a method of mitigating a fire risk from an IPT primary pad is provided, the method comprising creating an air flow over a top surface of the primary pad.

Preferably the method includes creating an air flow which flows over substantially the entire top surface of the primary pad.

Preferably the air flow which follows the top surface of the IPT charging pad under the influence of a boundary effect.

Preferably the boundary effect is the Coanda effect.

Preferably the air flow is configured as a substantially broad, thin sheet.

Preferably the method includes directing the air flow to follow a surface under the influence of a boundary effect prior to reaching the top surface of the primary pad.

Preferably the method includes using the charging pad as a second surface with a boundary effect.

In another aspect a foreign object detection apparatus for an IPT system is provided, the apparatus comprising infra-red detection means for detecting if an object positioned above or adjacent to an IPT primary pad has a temperature greater than a predetermined maximum temperature.

In another aspect an IPT charging system is provided comprising:
an IPT transmitter coil;
an IPT receiver coil; and
a control means;
wherein, in use, the control means
determines an expected rate of power transfer between the IPT transmitter coil and the IPT receiver coil;
determines the actual rate of power transfer; and
implements a fire mitigation strategy if the actual rate of power transfer is less than the expected rate by more than a predetermined variance.

Preferably the fire mitigation strategy comprises lowering the rate of power transfer.

Preferably the fire mitigation strategy comprises operating means for creating an air flow over the IPT charging pad.

Preferably the system comprises communication means for communicating information about one or both of the IPT transmitter coil and the IPT receiver coil to the control means.

According to another aspect a method of detecting the presence of a foreign object in a magnetic field created by an IPT transmitter coil comprises the steps of:
i) calculating an expected rate of power transfer between the IPT transmitter coil and an IPT receiver coil for a predetermined power input to the IPT transmitter coil;
ii) operating the IPT transmitter coil at the predetermined power input; and
iii) measuring the actual rate of power transfer to the IPT receiver coil.

Preferably the method comprises detecting a relative alignment between the IPT transmitter coil and PT receiver coil.

Preferably the method comprises determining if the actual rate of power transfer is less than the expected rate of power transfer by more than a predetermined amount.

According to another aspect a method of operating an IPT charging system comprises the steps of:
i) calculating an expected rate of power transfer between the IPT transmitter coil and an IPT receiver coil for a predetermined power input to the IPT transmitter coil;
ii) operating the IPT transmitter coil at the predetermined power input;
iii) measuring the actual rate of power transfer to IPT receiver coil;
iv) determining if actual rate of power transfer is less than the expected rate of power transfer by more than a predetermined amount; and
v) implementing a fire mitigation strategy if the actual rate of power transfer is less than the expected rate of power transfer by more than the predetermined amount.

Preferably the method comprises detecting a relative alignment between the IPT transmitter coil.

Preferably the fire mitigation strategy comprises operating means for creating an air flow over the IPT charging pad.

Preferably the fire mitigation strategy comprises reducing the power input to the IPT transmitter coil.

According to a further aspect a system for mitigating a fire risk from an IPT charging pad comprises means for creating an air flow over a top surface of the IPT charging pad.

Preferably the means for creating an air flow creates an air flow which flows over substantially the entire top surface of the IPT charging pad.

Preferably the means for creating an air flow creates an air flow which follows the top surface of the IPT charging pad under the influence of a boundary effect.

Preferably the boundary effect is the Coanda effect.

Preferably the air flow is configured as a substantially broad, thin sheet.

Preferably the system comprises control means for determining when the means for creating an air flow is operated.

Preferably the control means comprises timer means.

Preferably the control means comprises means for monitoring the power transmitted by the IPT pad, and the power received by a magnetically coupled IPT receiver pad, and determining that a foreign object is within the magnetic field generated by the charging pad.

Preferably the control means comprises infra-red detection means for detecting if an object positioned above the IPT charging pad has a temperature greater than a predetermined maximum temperature.

Preferably the means for creating an air flow comprises an elongate conduit provided with at least one outlet means provided on one side thereof.

Preferably the outlet means comprises an elongate slit.

Alternatively the outlet means comprises a plurality of outlet apertures.

Preferably the outlet apertures are substantially aligned.

Preferably the means for creating an air flow comprises a surface which the air flow follows under the influence of a boundary effect. Preferably the boundary effect is the Coanda effect.

Preferably the surface has a trailing edge which induces turbulence into the air flow.

Preferably the surface is spaced apart from the IPT charging pad.

According to a further aspect a method of mitigating a fire risk from an IPT charging pad comprises creating an air flow over a top surface of the IPT charging pad.

Preferably the method comprises creating an air flow which flows over substantially the entire top surface of the IPT charging pad.

Preferably the method comprises creating an air flow which follows the top surface of the IPT charging pad under the influence of a boundary effect.

Preferably the boundary effect is the Coanda effect.

Preferably the method comprises configuring the air flow as a substantially broad, thin sheet.

Preferably the method comprises directing the air flow to follow a surface under the influence of a boundary effect before the air flow reaches the top surface of the IPT charging pad.

The invention may also be said broadly to consist in the parts, elements and features referred to or indicated in the specification of the application, individually or collectively, in any or all combinations of two or more of said parts, elements or features, and where specific integers are mentioned herein which have known equivalents in the art to which the invention relates, such known equivalents are deemed to be incorporated herein as if individually set forth.

According to a still further aspect, an IPT charging system and/or a method of operating an IPT charging system is provided substantially as herein described, with reference to the accompanying drawings.

According to a still further aspect of the present invention, a system and/or method for mitigating a fire risk from an IPT charging pad is provided substantially as herein described, with reference to the accompanying drawings.

Further aspects of the invention, which should be considered in all its novel aspects, will become apparent from the following description given by way of example of possible embodiments of the invention.

Unless the context clearly requires otherwise, throughout the description and the claims, the words "comprise", "comprising", and the like, are to be construed in an inclusive sense as opposed to an exclusive or exhaustive sense, that is to say, in the sense of "including, but not limited to".

BRIEF DESCRIPTION OF PREFERRED EMBODIMENTS

The present invention allows foreign objects to be detected using the primary and/or secondary pad(s) of an IPT system. It also allows relative position or alignment of magnetic structures of an IPT system to be determined.

The present invention also recognises that some or substantially all of the problems associated with foreign objects on the IPT charging pad identified above may be mitigated or substantially eliminated if a sheet of air having a sufficient velocity can be blown across an upper face of the roadway mounted IPT charging pad.

An air flow with the correct shape, direction and velocity may perform the following functions:
1. Small metalized pieces are swept away before they catch fire.
2. Other small, potentially flammable debris such as dry leaves or paper may be swept away from the pad, thereby depriving any small fire of fuel.
3. Larger objects which are not swept away may be cooled by the air flow so that their temperature rise is kept within acceptable limits and does not present a hazard.

Very large objects may not be swept away. However, objects which are of a size that cannot be moved, or at least sufficiently cooled, by the airflow, are likely to be sufficiently large that they can be detected in the electrical power flow to the pick-up coil. Once such an object is detected the power transfer through the IPT pad can be adjusted or halted as necessary.

Figure 1:
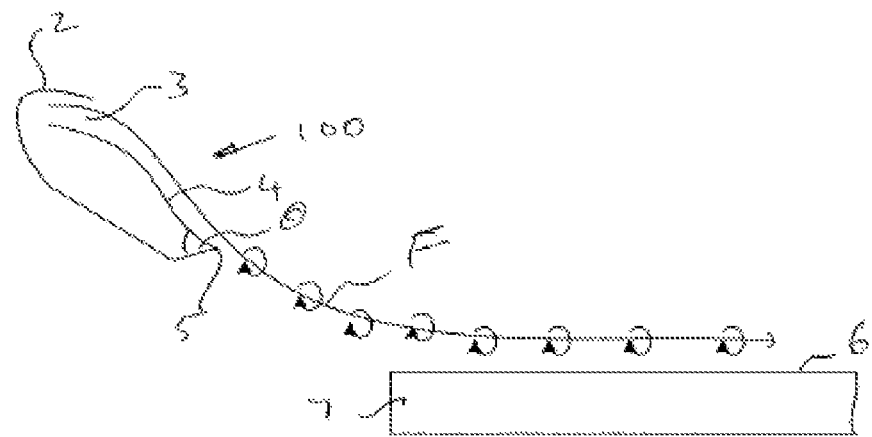
FIG. 1 is a diagrammatic side view of the system of the present invention in use, with the elongate conduit shown in cross-section.
Figure 2:
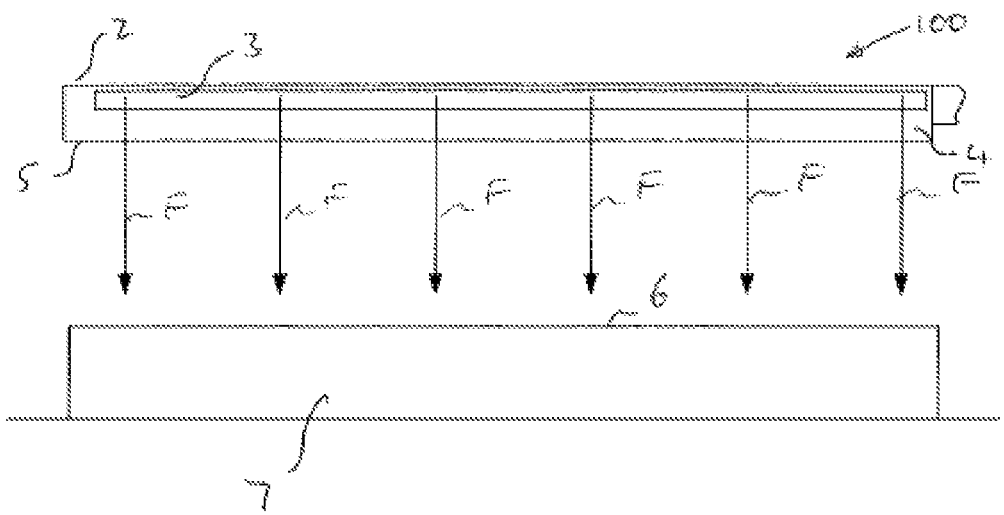
FIG. 2 is a diagrammatic front view of the elongate conduit and outlet of the system of FIG. 1.
Figure 3:
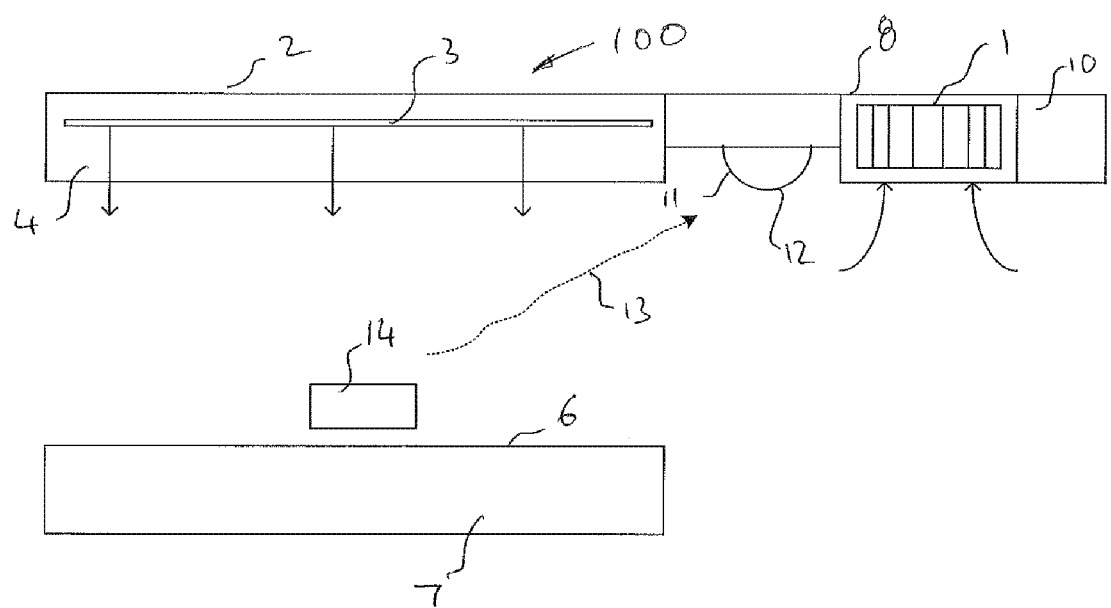
FIG. 3 is a diagrammatic front view of the system of FIG. 1 in use, with a foreign object being heated by the IPT charging pad.

Referring first to FIGS. 1, 2 and 3, a system for mitigating a fire risk from an IPT charging pad according to one embodiment of the present invention is generally referenced by arrow 100.

The system 100 comprises a means for creating an air flow which comprise an impeller means 1 in fluid communication with an elongate conduit 2. The conduit 2 has at least one outlet 3 provided on a side thereof. The outlet 3 is preferably an elongate slot, as shown in FIGS. 1 to 3, but in other embodiments multiple outlets may be provided side-by-side and in alignment with one another to approximate a slotted shape.

In a particularly preferred embodiment the conduit 2 defines a flow surface 4 immediately downstream of the outlet 3. The configuration of the outlet 3 and flow surface 4 is preferably such that air flow F from the outlet 3 follows the flow surface 4 under the influence of a boundary effect, typically the Coanda effect. The flow surface 4 may have a cambered profile.

The trailing edge 5 of the flow surface 4 preferably defines an included angle which is sufficiently small that the air flow F detaches from the trailing edge 5 and becomes turbulent.

The air flow F from the trailing edge 5 travels along a substantially straight path until it contacts the upper surface 6 of the IPT charging pad 7. However, as the air flow travels between the trailing edge 5 and the upper surface 6 the ambient air surrounding the air flow is accelerated and joins the air flow, increasing the mass of air which is moving, but decreasing the average velocity of the flow.

Those skilled in the art will appreciate that while the pad 7 is shown protruding above the ground, it may be mounted substantially flush with the ground or even below ground level.

The angle that the air flow F impinges on the upper surface 6 is selected to ensure that the air flow remains attached to the upper surface 6 under the influence of a boundary condition, typically the Coanda effect. The angle of approach is preferably between 10° and 70°, more preferably between 30° and 60°, and most preferably around 45°. The applicants have chosen 45° as the best compromise between ensuring that the flow attaches to the surface of the pad under the influence of the Coanda effect, and minimising the distance which the outlet 3 must be positioned in front of the pad 7.

The air flow F preferably travels over substantially the entire upper surface 6. The velocity of the air flow at the outlet 3 is selected such that the average velocity of the air flow over the upper surface is at least 5 m/s, and more preferably at least 10 m/s. The applicant has found that air speeds in this range are suitable for clearing the pad 7 of small foreign objects such as foil, paper, metalized plastic and leaves, and for providing adequate cooling of larger objects such as aluminium cans.

The turbulence in the air flow F over the pad 7 is beneficial in improving the heat transfer coefficient between the air and any larger objects, and cooling them.

In contrast to air flow systems which use an unducted axial flow fan, the air-flow creating means can be configured to have a relatively low profile, and so is relatively easy to position and mount in the space available between the IPT pad 7 and the underside of the vehicle which carries the receiving IPT pad (not shown).

The system is rugged and reliable as all moving parts (e.g. the impeller and motor) can be provided within a suitable housing 8. In preferred embodiments the impeller 1 may be mounted remotely from the outlet 3.

The system 100 preferably comprises a control means 10. In preferred embodiments the control means controls the impeller 1 so that it does not run continuously under normal conditions. In some embodiments the control means 10 may comprise a timer and the impeller 1 may be run for predetermined periods at timed intervals. Additionally or alternatively the control means 10 may be provided with and/or may be in communication with one or more sensor means 11 which detect the presence of a foreign object which indicates that the air flow F may be required. In one embodiment the sensor means 11 may comprise a passive infra-red (PIR) sensor 12 which is capable of detecting infra-red radiation 13 which is characteristic of an object 14 being heated to above a minimum or threshold temperature. In another embodiment (not shown) the control means may comprise sensor means which detect changes to the magnetic field created by the pad 7 which are indicative of an object being within the field. In yet another embodiment the sensor means may comprise means for monitoring the temperature of the upper surface 6 of the pad 7, or the air adjacent the pad (or any material, such as a road surface for example, covering the pad. For avoidance of doubt, references to the top or upper surface of the pad 7 include where relevant the upper or top surface of a material covering the pad). This may assist in identification of foreign objects which are being heated, but may also be used to activate the impeller 1 if the temperature of the pad 7 increases above a predetermined maximum regardless of the presence of any foreign object. In this way the system may also provide the additional advantage of enhancing the efficiency of the IPT pad by cooling the pad. However, the shape, velocity, direction and turbulence of the air flow are preferably selected to achieve the objectives of moving objects off the pad and/or cooling objects on top of the pad, rather than cooling the pad itself.

The control means 10 is capable of checking for the presence of foreign objects over the IPT pad 7.

In a preferred embodiment the location (position relative to the primary or transmitter pad), size, geometry, and tuning of the secondary receiver, along with the power being delivered from the primary and available at the secondary, are determined by and/or known to the control means 10. In some embodiments this information is conveyed via a communication means (not shown) between the transmitter side charging circuit and the vehicle/receiver side charging circuit. Such a communication system is an essential feature of many IPT charging protocols.

In one embodiment a parallel tuned charging system is used. In order to assist in detection of inter-pad alignment, and power detection, a short circuit may be applied to the secondary or receiver pad (while in the case of series tuned systems an open circuit should be applied). A short circuit applied to the secondary coil or coils represents an effective no-load condition.

An alternative means that enables the system loss to be determined and used to help detect a foreign object during power transfer (thereby removing the necessity of shutting down power transfer for detection), includes sharing information about the power transfer over a communications channel between the secondary and primary pads. As is noted above, this information sharing is essential in stationary charging applications where the secondary must inform the primary of demands from the vehicle's battery management system to help regulate the charging system for maximum efficiency. The secondary electronics can use measurements of current and voltage at the output of the tuned circuit and/or at the output of the electronics connected to the battery load on the secondary to determine the exact power being received and delivered to the vehicle's battery. This information can be shared with the primary electronics to help determine loss. On the primary side, real power can be measured using measurements from the mains and/or measurement of inverter bridge currents to establish the power being delivered. The difference between the power being delivered from the primary and being received at the secondary can be calculated and used to determine loss. Any loss beyond what is deemed to be acceptable may trigger a fault condition. This calculation of loss can be undertaken continuously so that a step change in loss due to a foreign object being inserted can be quickly detected as the object moves between the pads.

To assist in determining an expected level of loss, it is helpful to establish the relative position of the secondary and primary pads, and to know their size and topology. This information can be conveyed between the primary and secondary systems via communications or RFID tags for example, while the former (the relative position of the pad) may be determined in one embodiment using the method described below.

To determine the relative position of the transmitter and receiver pads, both the magnitude and phase of the current in the secondary (receiver) coil or coils can be measured and used to determine where the receiver pad is in relation to the primary. For pads which have multiple secondary coils for power extraction (such as the DDQ pads as defined in PCT/NZ2011/000153 which have two generally planar coils arranged side by side and a central quadrature "Q" coil overlapping the side by side coils, or the or Bipolar pads defined in WO2011/016737 and PCT/NZ2011/000154 which have two generally planar overlapping mutually decoupled coils), the measurement of phase and magnitude of the short circuit currents in the respective power coils provide sufficient information to determine relative lateral offset from the centrally aligned position in the X and Y directions, while a comparison of the magnitude of the primary pad current to the magnitude of the currents in the secondary coils can help to identify the height or air gap in the system as a result of coupling changes. To achieve this, current sensors are added after the tuning of each receiver coil (prior to rectification). In the case of a DDQ receiver, one coil measures "horizontal" flux and the other "vertical" flux components. Therefore when displaced laterally there is a change in magnitude, and also a relative shift in phase of approximately 180 degrees (the actual shift will vary slightly based on the level of mistuning and coil quality) when the receiver is positioned either to the left or right of the transmitter coil. This relative phase shift between the output of the two receiver coils arises independently of whether the primary pad on the ground is a circular or polarised structure, or another magnetic structure, such as a track for example. Along with this, the magnitude of the received voltage coupled into the coil collapses to zero at defined locations relative to the primary structure. As an example, in the central aligned position no voltage is coupled in the Q coil if the primary is a polarised structure, while if the primary is a circular structure no voltage is coupled in the DD coil. As the receiver moves laterally the coupled voltage builds up in one coil and drops in the other, and this variation can help determine the lateral position, while variation in phase between the receiving coils helps determine which side the receiver is displaced. Similar results can be achieved using current sensors placed at the output of a Bipolar pad used as a receiving structure.

Relative position in the y direction (the direction of travel of the vehicle) can be determined when the secondary structure is moved in the Y direction, for example when the secondary structure is mounted beneath a car which is moving into position to park. Under these conditions there will be an increase in magnitude of the coupled voltage in the coils of the structure and short circuit current when the receiver is shut off (which is the common condition as the vehicle moves into position). When the vehicle passes the central position this coupled voltage will decrease.

For secondary systems with only one coil (as in the circular pad system described in WO2008/140333) additional search coils which are uncoupled from the secondary could be placed around the pad to aid alignment and parking in the manner described above.

Figure 4:
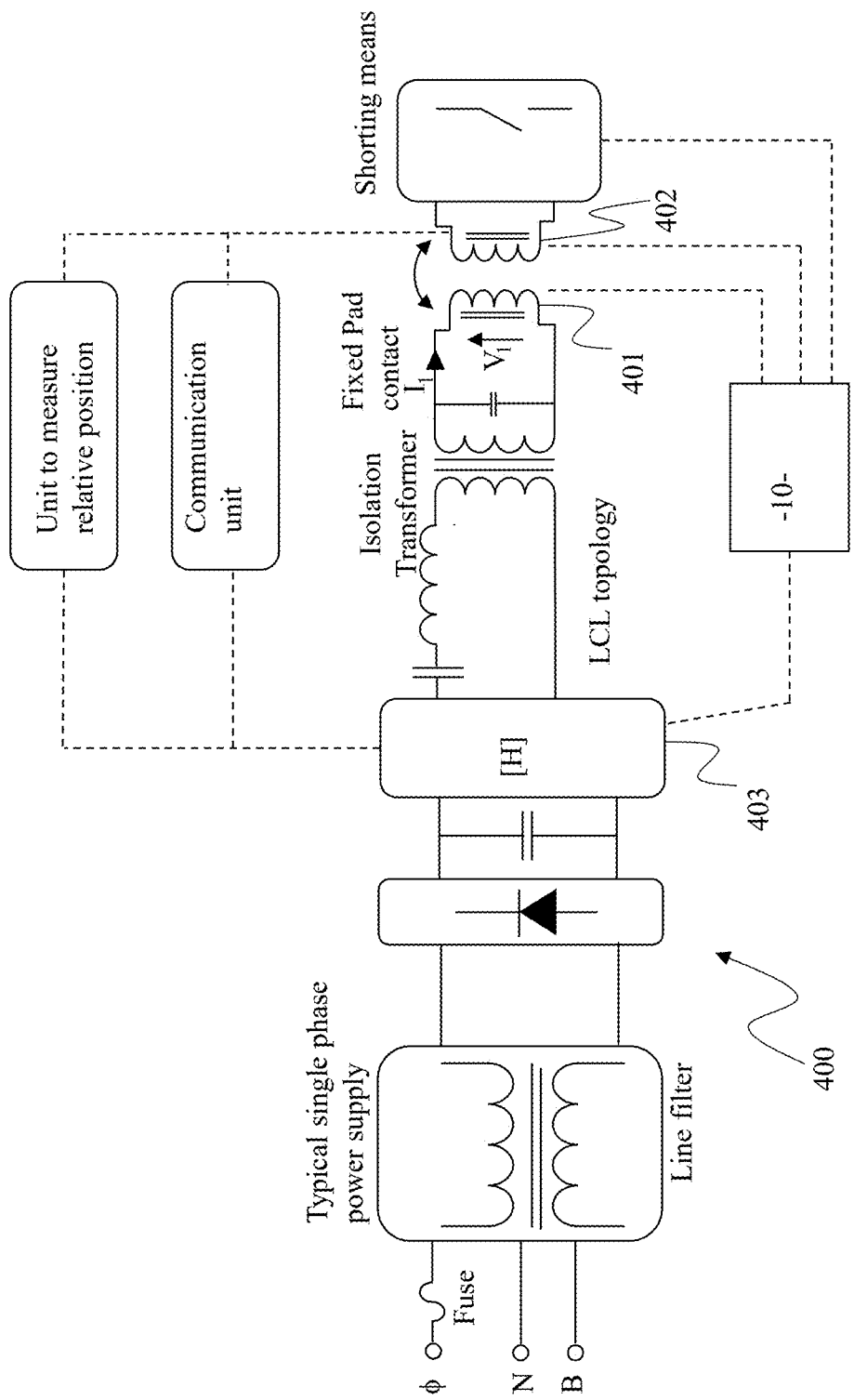
FIG. 4 shows a configuration for a charging system using a fixed frequency LCL converter (with added transformer isolation) driving a known current $I_1$ into a primary pad.

Referring to FIG. 4, an example of an IPT system 400 in the form of a charging system using a fixed frequency LCL converter (with added transformer isolation) driving a known current into a primary pad 401 is shown. The general structure of the system 400 is known but the control means 10 is not known as described in this document.

When the secondary pad 402 is placed under a short circuit condition, both the current f, in the track and the current in the inverter bridge (an H-bridge configuration 403 as indicated here) can be regulated. When under ideal tuning conditions the current flowing in the H bridge is real and represents the load (which are the losses in the system under short circuit conditions). With variations in position and tuning there will be additional VAR currents (however these should be small) and can be inferred if the relative position of the secondary with the primary can be determined. Additionally the mains current and voltages can be measured allowing the actual Watts and VARs to be determined. As stated earlier, these loss measurements can also be undertaken in situ during power transfer using an active communication channel to share information between the primary and secondary.

Therefore, having determined VAR currents due to relative position between the primary and secondary structures, the actual VAR currents in the primary structure can be used to determine whether a foreign object is present on or adjacent to the IPT primary pad.

When a foreign object which can be heated is placed between the primary and secondary pads the VA delivered to the secondary will be reduced, as some of the flux will intercept the foreign object exciting eddy currents and loss. This lowers the flux in the secondary pad so that the short circuit current magnitude reduces. If the object is large enough this reduction can be detected. In the worst case no flux may couple the secondary at all (for example in the case where a metal plate is placed in between the charging pads). The loss in the object is also represented by an increase in magnitude of the current in the H bridge. Under short circuit conditions this current is quite small and should be known within a valid range if the position and geometry and tuning of the secondary is known. Thus any additional losses due to the foreign object are able to be detected.

Figure 5:
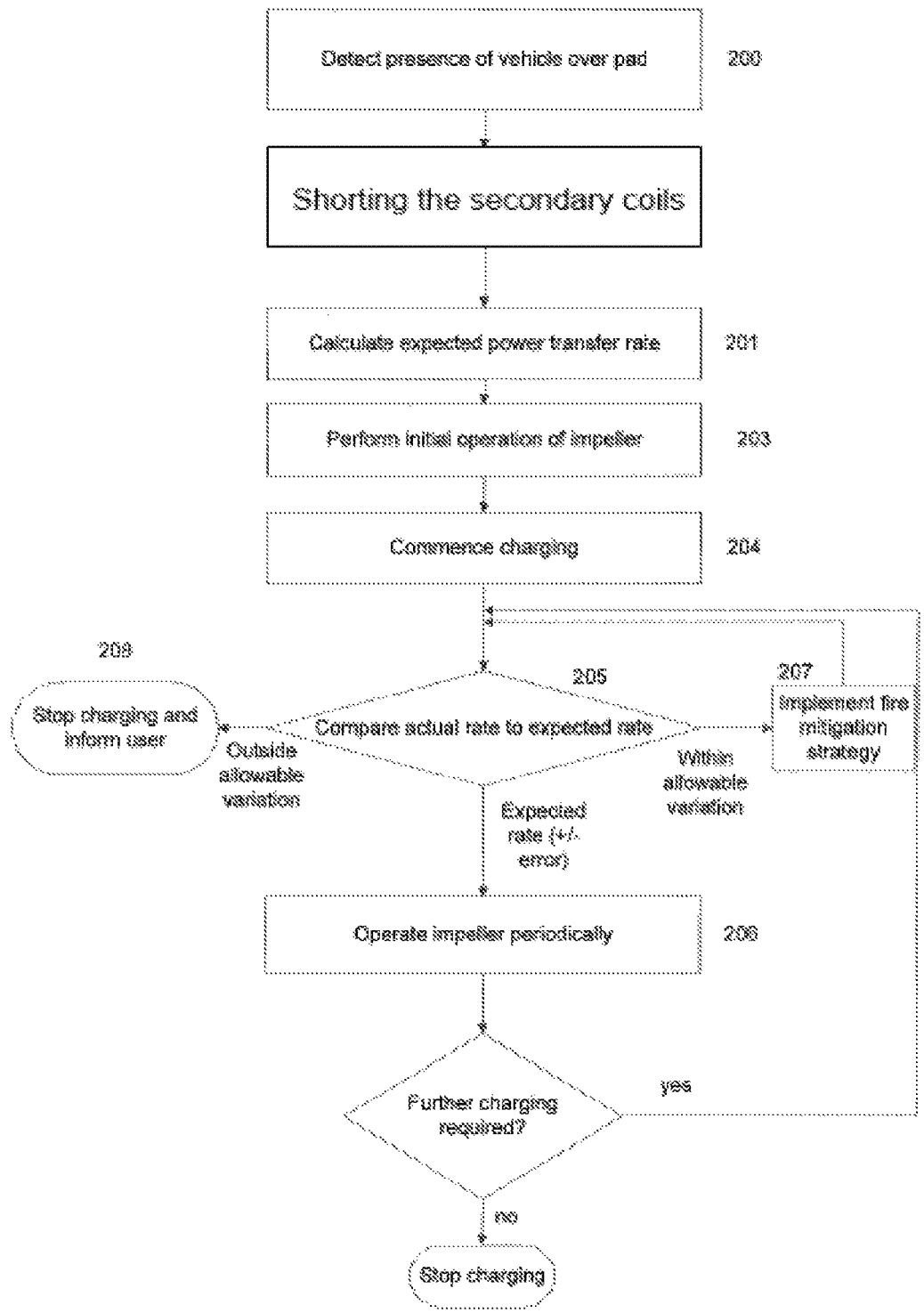
FIG. 5 is a schematic flow chart showing the operation of an embodiment of the invention.

In one embodiment the system may operate as broadly illustrated in FIG. 5.

At step 200 the system detects when a vehicle has been moved into a charging position and a charging cycle initiated. At step 201 the system calculates an expected rate of power transfer to the vehicle using one or more of the methods described above.

Before the charging operation is commenced the impeller is operated for a period to clear the pad of any debris (step 203). The charging operation then commences at step 204.

At step 205 the actual rate of power transfer is compared to the expected rate. If the rate is as expected (or at least within a small range, for example equal to the margin of error of the expected transfer rate calculation), then the system operates the impeller periodically (step 206) (for example under a 1:10 duty cycle) and continues to monitor the power transfer rate in case an anomaly arises.

If the power transfer rate is smaller than expected, but within an allowable range of the expected value (such as would indicate that an object is on the pad, but is sufficiently small that it can be kept cool by the air flow), then the control means may implement a fire mitigation strategy (step 207). This could include operating the impeller to create an air flow and/or reducing the power to the transmitter pad. The control means continues to monitor the power transfer rate between the transmitter and receiver pads.

The fire mitigation strategy selected may depend on the amount of power which is calculated as being absorbed by the foreign object. For example, relatively small power losses may result in the impeller being used only slightly more frequently than it would be used if substantially no power loss was occurring. However, if the calculated power loss is close to the maximum allowable then the rate of power transfer may be decreased, and the impeller operated frequently or continuously. While this may result in the charging operation being relatively slow and inefficient, it does avoid the situation that a user returns to the vehicle to find that no charging has occurred at all.

If the power transfer rate is smaller than expected, and is outside the allowable range (such as to suggest that an object is on the pad and is too large to be kept cool), then the controller may halt the charging operation (step 208) and activate some form of alert or alarm to indicate to the user that this has occurred. While this is the least desirable result, in some cases it may not be possible to continue charging safely, even at low charging rates and with the impeller operating continuously.

In some embodiments the system may also receive input from additional sensors (for example temperature or Infrared sensors) and may implement a fire mitigation strategy or stop the charging altogether if the sensor(s) indicate that an object is being heated to above an acceptable temperature. This may occur even if the difference between the actual power transfer rate and the expected power transfer rate is within the margin of error of the calculation.

In another embodiment, an infra-red camera or sensor may be used for scanning the region between primary and secondary magnetic structures. In some embodiments a plurality of cameras or sensors arranged in various locations or provided in an array may be required to provide sufficient information. In the example of a vehicle charging system, the camera or sensor may be mounted under the vehicle. If the camera moves with the vehicle it will need to be very rugged to withstand the expected conditions, for example stones, water, and ice. If the camera or sensor is stationary it will need to be protected against damage from other vehicles, vandals, and also weather.

A further advantage of the invention may be that cats or other pets may find the air flow uncomfortable, and so may be dissuaded from sitting on the IPT charging pad. As the pad may be somewhat heated during normal use, it may otherwise be an attractive place for pets to sit. Since the IPT charging pad may be operating at between 20 kHz to 30 kHz, it may be relatively easy to create a tone at the charging frequency which is audible (and irritating) to animals such as cats and dogs, but inaudible to humans. This may also assist in keeping pets away from the pads.

There is some flexibility possible in the location of the components of the system. For example, in preferred embodiments the impeller and conduit may be mounted to the vehicle, so as to be available wherever the vehicle is charged. However, in some embodiments these components may be mounted to the ground or floor adjacent the transmitter pad.

The control means 10 may be mounted adjacent the impeller and conduit. However, in other embodiments the control means 10 may be remote from these components. In some embodiments the control means may be associated with the transmitter coil, while in other embodiments the control means may be mounted to the vehicle.

The foreign object detection methods and apparatus described above may be used quite separately or independently from any apparatus for removing a detected object (such as the air flow system). Similarly, the relative position or alignment methods and apparatus described above may be used in IPT systems generally without limitation to detection of foreign objects, and without limitation to pad based systems.

Unless the context clearly requires otherwise, throughout the description and the claims, the words "comprise", "comprising", and the like, are to be construed in an inclusive sense as opposed to an exclusive or exhaustive sense, that is to say, in the sense of "including, but not limited to".

Where in the foregoing description, reference has been made to specific components or integers of the invention having known equivalents, then such equivalents are herein incorporated as if individually set forth.

Although this invention has been described by way of example and with reference to possible embodiments thereof, it is to be understood that modifications or improvements may be made thereto without departing from the spirit or scope of the invention.

The invention claimed is:

1. A foreign object detection apparatus comprising a control adapted to detect the presence of a foreign object on or adjacent to a primary magnetic structure of an Inductive Power Transfer (IPT) system, the control configured to place a secondary magnetic structure of the IPT system under a no-load condition and detect the no-load current of the secondary magnetic structure to detect the presence of the foreign object, wherein at least one of:
the apparatus is adapted to measure the phase and magnitude of the no-load current in the secondary magnetic structure to determine the lateral offset of the primary and secondary magnetic structures;
the control is configured to detect a foreign object on or adjacent the primary magnetic structure from a reduction in the no-load current in the secondary magnetic structure; or
the apparatus is configured to detect VAR currents in the primary magnetic structure, estimate a component of the detected VAR currents that is attributable to misalignment of the primary magnetic structure and the secondary magnetic structure, and determine that the foreign object is on or adjacent the primary pad when the detected VAR currents deviate from an expected range of VAR currents.

2. The apparatus as claimed in claim 1 wherein the control is adapted to selectively reduce power transferred by the system on detection of the foreign object.

3. The apparatus as claimed in claim 1 wherein the apparatus is adapted to measure the phase and magnitude of the no-load current in the secondary magnetic structure to determine the lateral offset of the primary and secondary magnetic structures.

4. The apparatus as claimed in claim 1 wherein the control is configured to detect the foreign object on or adjacent the primary magnetic structure from a reduction in the no-load current in the secondary magnetic structure.

5. The apparatus as claimed in claim 1 wherein the control is configured to detect the foreign object on or adjacent the primary magnetic structure from changes in both the no-load current of the secondary magnetic structure and current supplied to the primary magnetic structure when the secondary magnetic structure is in the no-load condition.

6. The apparatus as claimed in claim 1 wherein the control is configured to detect the foreign object on or adjacent the primary magnetic structure from changes in the no-load current of the secondary magnetic structure.

7. The apparatus as claimed in claim 1 wherein the apparatus is configured to detect VAR currents in the primary magnetic structure, estimate a component of the detected VAR currents that is attributable to misalignment of the primary magnetic structure and the secondary magnetic structure, and determine that the foreign object is on or adjacent the primary pad when the detected VAR currents deviate from an expected range of VAR currents.

8. A foreign object detection apparatus comprising a control adapted to detect the presence of a foreign object on or adjacent to a primary magnetic structure of an Inductive Power Transfer (IPT) system, the control configured to place a secondary magnetic structure of the IPT system under a no-load condition and detect the no-load current of the secondary magnetic structure to detect the presence of the foreign object, wherein the control detects the foreign object when the secondary is in the no-load condition by at least:
determining an expected rate of power transfer;
determining the actual rate of power transfer; and
comparing the expected rate of power transfer with the actual rate of power transfer.

9. The apparatus as claimed in claim 8 further comprising determining if the actual rate of power transfer is less than the expected rate of power transfer by more than a predetermined amount.

10. The apparatus as claimed in claim 8 wherein the apparatus is configured to compare relative electrical characteristics of the primary magnetic structure and the secondary magnetic structure, when the secondary magnetic structure is in the no-load condition, to determine relative position between the primary magnetic structure and the secondary magnetic structure.

11. The apparatus as claimed in claim 8 wherein the apparatus is configured to compare the magnitude of current in the primary magnetic structure to the magnitude of current in the secondary magnetic structure, and determine the separation between the primary magnetic structure and the secondary magnetic structure from the relative magnitude of current in the primary magnetic structure and secondary magnetic structure.

12. The apparatus as claimed in claim 8 wherein the control is configured to detect a foreign object on or adjacent to the primary magnetic structure from an increase in the current supplied to the primary magnetic structure when the secondary magnetic structure is in the no-load condition.

13. The apparatus as claimed in claim 8 wherein the control is configured to detect a foreign object on or adjacent the primary magnetic structure from changes in current supplied to the primary magnetic structure when the secondary magnetic structure is in the no-load condition.

14. The apparatus as claimed in claim 8 wherein the apparatus is configured to short circuit a parallel tuned pick-up coil of the secondary magnetic structure to place the secondary magnetic structure in the no-load condition.

15. The apparatus as claimed in claim 8 wherein the apparatus is configured to measure AC current in at least one pick-up coil of the secondary magnetic structure prior to rectification.

16. A method of operating an Inductive Power Transfer (IPT) system comprising a primary magnetic structure and a secondary magnetic structure to detect the presence of a foreign object adjacent to the primary magnetic structure, the method comprising placing the secondary magnetic structure under a no-load condition and detecting the no-load current of the secondary magnetic structure to detect the presence of the foreign object, wherein the method further comprises at least one of:

determining that a foreign object is on or adjacent the primary magnetic structure from a reduction in the no-load current in the secondary magnetic structure; or measuring the phase and magnitude of no-load current in the secondary magnetic structure, and estimating the relative position of the secondary magnetic structure and the primary magnetic structure from the measured no-load current.

17. A method as claimed in claim 16 further comprising:
determining an expected rate of power transfer;
determining the actual rate of power transfer; and
comparing the expected rate of power transfer with the actual rate of power transfer.

18. The method as in claimed in claim 17 further comprising determining if the actual rate of power transfer is less than the expected rate of power transfer by more than a predetermined amount.

19. The method as claimed in claim 16 wherein the method comprises measuring the phase and magnitude of no-load current in the secondary magnetic structure, and estimating the relative position of the secondary magnetic structure and the primary magnetic structure from the measured no-load current.

20. The method as claimed in claim 16 wherein the method comprises comparing the magnitude of current in the primary magnetic structure to the magnitude of current in the secondary magnetic structure, and determining the separation between the primary magnetic structure and the secondary magnetic structure from the relative magnitude of current in the primary magnetic structure and the secondary magnetic structure.

21. The method as claimed in claim 16 comprising determining that the foreign object is on or adjacent the primary magnetic structure from the reduction in the no-load current in the secondary magnetic structure.

22. The method as claimed in claim 16 comprising determining that the foreign object is on or adjacent the primary magnetic structure from an increase in current supplied to the primary magnetic structure when the secondary magnetic structure is in the no-load condition.

23. The method as claimed in claim 16 comprising determining that the foreign object is on or adjacent the primary magnetic structure from changes in both the no-load current of the secondary magnetic structure and current supplied to the primary magnetic structure when the secondary magnetic structure is in the no-load condition.

24. The method as claimed in claim 16 wherein the method comprises shorting a pick-up coil of the secondary magnetic structure to place the secondary magnetic structure in the no-load condition.

25. The method as claimed in claim 16 wherein the method comprises detecting an AC current induced in a pick-up coil of the secondary magnetic structure when the secondary magnetic structure is under the no-load condition.

26. A method comprising periodically shorting the coil of a resonant secondary pad, while the secondary pad is receiving power from a primary pad, to detect the presence of a foreign object on or adjacent the primary pad, wherein the method comprises detecting at least one of a reduction in short circuit current in the coil secondary pad, or an increase in current supplied to a coil of the primary pad when the secondary coil is shorted.

27. The method of claim 26, wherein the method comprises measuring an induced AC current in the coil of the secondary pad when the coil is shorted.

28. The method of claim 26, wherein the method comprises measuring VAR currents in the primary pad, and determining that a foreign object is on or adjacent the primary pad from deviation of the measured VAR currents from an expected VAR current.

29. The method of claim 28, wherein the method comprises determining a component of the VAR currents measured in the primary pad that is attributable to misalignment of the primary pad and the secondary pad.

30. The method of claim 26, wherein the method comprises detecting a reduction in short circuit current in the coil secondary pad.

31. The method of claim 26, wherein the method comprises detecting an increase in current supplied to a coil of the primary pad when the secondary coil is shorted.

* * * * *